US005930590A

United States Patent [19]
Busta

[11] Patent Number: 5,930,590
[45] Date of Patent: Jul. 27, 1999

[54] FABRICATION OF VOLCANO-SHAPED FIELD EMITTERS BY CHEMICAL-MECHANICAL POLISHING (CMP)

[75] Inventor: Heinz H. Busta, Park Ridge, Ill.

[73] Assignee: American Energy Services, Columbus, Ohio

[21] Appl. No.: 08/908,144

[22] Filed: Aug. 6, 1997

[51] Int. Cl.$^6$ .................... H01L 21/00
[52] U.S. Cl. .................... 438/20
[58] Field of Search .................... 438/20, 22, 34, 438/42; 257/10

[56] References Cited

U.S. PATENT DOCUMENTS

| | | | |
|---|---|---|---|
| 3,665,241 | 5/1972 | Spindt et al. | 313/351 |
| 3,972,060 | 7/1976 | Hara et al. | 257/10 |
| 4,193,226 | 3/1980 | Gill, Jr. et al. | 51/124 R |
| 4,811,522 | 3/1989 | Gill, Jr. | 51/131.1 |
| 5,227,699 | 7/1993 | Busta | 315/291 |
| 5,229,331 | 7/1993 | Doan et al. | 437/228 |
| 5,382,185 | 1/1995 | Gray et al. | 445/49 |
| 5,780,318 | 8/1996 | Hirano et al. | 438/20 |

OTHER PUBLICATIONS

Burke, Semi–Empirical Modeling of $SiO_2$ Chemical–Mechanical Polishing Planarization, June 11–12, 1991 pp. 370–384.
Baran, LCD's and Beyond, Feb. 1991 p. 229–236.
Warnock, A Two–Dimensional Process Model for Chemimechanical Polish Planarization, Aug. 1991 pp. 2398–2402.
Baran, Competition for Active Matrix, Jan. 1994 p.24.
Pogemiller, Gated Chromium Volcano Emitters, Mar./Apr. 1994 pp. 680–684.
J.B., Field–Effect Displays Given Boost by Dod, May 1994 pp.18–19.
Martinez, Chemical–Mechanical Polishing: Route to Global Planarization, May 1994 pp. 26,29,31.
Jairath, Chemical–Mechanical Polishing:Process Manufacturability, Jul. 1994 pp. 71–75.
Steigerwald, Pattern Geometry Effects in the Chemical–Mechanical Polishing of Inlaid Copper Structures Oct. 1994 pp. 2842–2848.
Malik, Manufacturability of the CMP Process, 1995 pp. 612–615.
Spallas, Fieldemitter Array Patterning for Large Scale Flat Panel Displays Using Inference Lithography, 1995 p.103.
Fury, Emerging Developments in CMP for Semiconductor Planarization, Apr. 1995.
Presentations By Silicon Video Corp. Apr. 30–May 3, 1995.
Levine, Field Emission Displays Based on Benefits of the Lateral Resistor in a Fed Jun. 21, 1995.
Fury, Emerging Developments in CMP for Semi–conductor Planarization–Part 2, Jul. 1995, pp.81–89.
Fury, CMP Standards: A Frustration Cure, Nov. 1995 pp. 74–77.
Cook et al, Theoretical and Practical Aspects of Dielectric and Metal CMP, Nov. 1995 pp. 141–144.

(List continued on next page.)

*Primary Examiner*—Tuan H. Nguyen
*Assistant Examiner*—Craig Thompson
*Attorney, Agent, or Firm*—Mueller and Smith, LPA

[57] ABSTRACT

A method for fabrication of volcano-shaped field emitters forming low-cost, large area manufacturing of ungated and gated vertical field emitter arrays. Gate and emitter thin films are deposited onto a substrate on which arrays of posts have been previously fabricated. These conformal films cover the substrate, the sidewalls of the posts, and the post top surfaces or plateaus. By using chemical-mechanical polishing (CMP), some or all of the thin films are selectively removed, leaving an intermediate structure that, after removing a small portion of the gate-to-emitter insulating film, is suitable for cold electron emission. One embodiment discloses a method of forming these devices without resort to a planarization layer. A second embodiment discloses a methodology employing a planarization layer.

9 Claims, 10 Drawing Sheets

OTHER PUBLICATIONS

Nanz, et al., Modeling of Chemical–Mechanical Polishing: A Review, Nov. 1995, pp. 382–389.

Larios, et al., Post –CMP Cleaning for Oxide and Tungsten Applications, May 1996 pp. 121–128.

Leach, Local Planarization Process Developed for Higher Yields, Oct. 1996, pp. 137–142.

Tseng, et al., Effects of Mechanical Characteristics on the Mechanical Polishing of Dielectric Thin Films, 1996, pp. 458–463.

Busta, et al., Fabrication of Volcano Emitters Using CMP, Jul. 7–12, 1996, pp. 388–392.

Schofield, Phosphors May Improve Laptop Screens, Dec. 16, 1996 p.10.

DA, New LCD Challenger to Arrive Around Year 2000, Apr. 1997, pp. 26.

Werner, The Flowering of Flat Panel Displays, May 1997, pp. 40–49.

FIG. 1
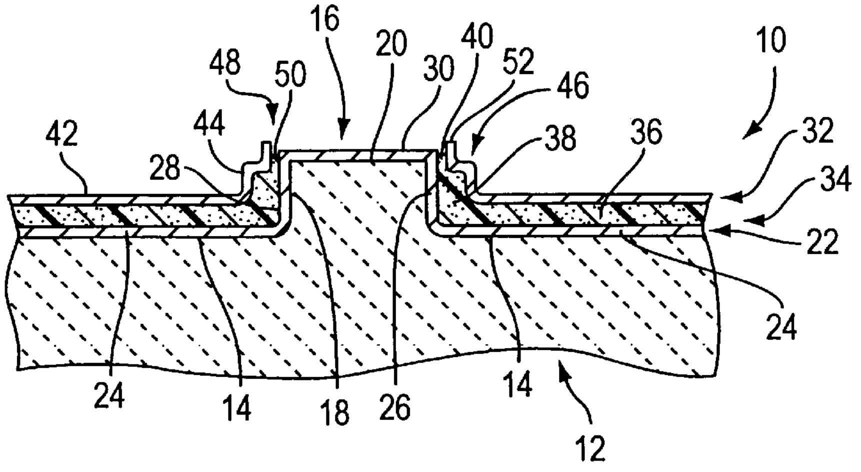
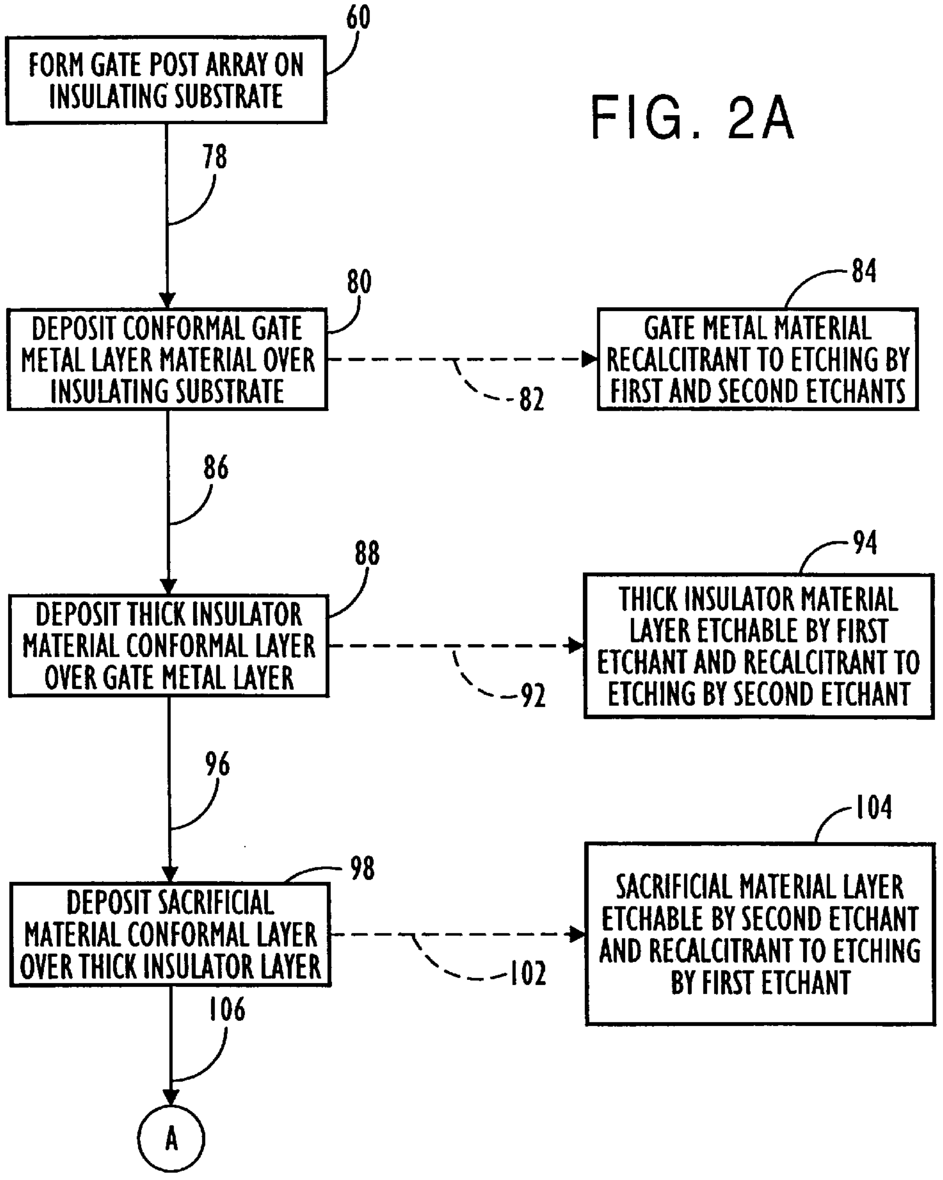
FIG. 2A

FABRICATION OF VOLCANO-SHAPED FIELD EMITTERS BY CHEMICAL-MECHANICAL POLISHING (CMP)

BACKGROUND OF THE INVENTION

Field emitters hold the promise for realization of related large-scale imaging systems. Ranging in size from thirty to forty inches, such systems would replace existing LCDs and plasma displays and could be used for big screen TVs and billboard signs. The advantages of a field emitter display (FED) are lower power requirements, wider viewing angles and higher quality images. Developing methods for manufacturing such displays has proven difficult, but advances in field emitters have made the production of large-scale FED arrays an important subject of study.

LCDs must reconcile the quality of the image produced with the power required to create the image. Because they do not produce their own light but are backlit, LCDs have high power requirements, but lowering the power for the backlights affects the brightness and contrast of the resulting image. Increasing the size of the image compounds this problem. LCDs also have a limited viewing angle. If the screen is viewed from too great an angle then it appears to go black. (photographic negative) Plasma display panels (PDPs) avoid some of the problems associated with LCDs, but high voltage requirements necessitate the use of expensive driver circuits, and CRT technology still produces a sharper, clearer image.

Field emitters are based on existing cathode-ray tube (CRT) technology. Based on thermionic emission, CRTs use heat energy to overcome the work function of electrons so that they are freed from the cathode material and can be accelerated by a positive voltage. The directed electron beam then strikes a phosphorous screen, transferring energy to the phosphorous. The phosphorous then releases the energy in the form of photons which pass through a glass screen creating the image on the display. In field emitters, the CRT high voltage electron gun is replaced by cold electron source arrays.

Most cold electron source arrays consist of conical-shaped conductors or semi-conductors that are surrounded by small gates with typical diameters ranging from 0.5 to 1.5 micrometers. Metallic cone emitters are disclosed, for example by C. Spindt in U.S. Pat. No. 3,665,261, and semi-conductive cone emitters are described, for example by H. Busta in U.S. Pat. No. 5,277,699, entitled "Recessed Gate Field Emission," issued Jul. 13, 1993. See generally:

(1) Presentations by Silicon Video Corporation, Micron Display Corporation and FED Corporation at the ARPA High Definition Systems Information Conference, Arlington, Va., Apr. 30–May 3, 1995.

(2) J. Levine, "Field Emission Displays," American Vacuum Society Test Panel Display Processing and Research Tutorial, Jun. 21, San Jose, Calif. 1995.

To form these cone arrays, typical photolithographic processing tools, as they are used in the manufacture of integrated circuits on eight inch diameter wafers, are employed. Such processing tools include UV light optical steppers and electron beam exposure systems. For arrays that can be fabricated on eight inch diameter substrates, these tools are perfectly adequate. However, for FEDs having principal dimensions of 12 to 20 inches and larger, adequate photolithographic tools do not yet exist for exposing these small (micron and submicron) gate diameters. See in this regard:

(3) J. P. Spallas et. al., "Field Emitter Array Patterning for Large Scale Flat Panel Displays Using Laser Interference Lithography," Technical Digest Eighth Intern. Vacuum Microelectronics Conf., Portland, Oreg., p. 103, 1995.

Fortunately, different field emitter structures exist in which the small spacing between the extraction gate and the emitter is obtained by a thin film deposition step and not by lithography. These devices are typically referred to as volcano shaped field emitters or as vertical (thin film) edge emitters. A production technique has been proposed wherein these devices are employed to fabricate arrays using printed wiring board-type lithography. See the following publication:

(4) J. E. Pogemiller, H. H. Busta, and B. J. Zimmerman, "Gated Chromium Volcano Emitters," J. Vac. Sci. Technology B 12 (2), p. 680, 1993.

Field emitters have been designed which exhibit lower capacitance levels adequate to achieve practical turn-on voltages. These devices also have configured electrode spacing dielectric components to avoid pinhole phenomena thus assuring more stable performance of the device. Such devices are described in U.S. Pat. No. 5,874,808 issued Feb. 23, 1999 and assigned in common herewith.

To create an array of field emitters, the techniques of spin-on glass and resist etchback are used to remove metal or dielectric layers. While these techniques are widely used in the industry for small displays, they are inadequate for formation of displays which have larger diagonal dimensions, for instance, about twenty inches or greater. Both spin-on glass and resist etchback require the build-up of photoresist on the surface to be removed and such build-up becomes difficult to achieve when forming large displays. In this regard, practical fabrication capabilities essentially preclude photoresist application by spinning, meniscus coating approaches being resorted to. These latter coating procedures, while less expensive to carry out, do not deliver the desired photoresist profiles.

BRIEF SUMMARY OF THE INVENTION

The present invention is directed to a process for producing field emission devices, particularly large arrays of such devices. Utilizing chemical-mechanical polishing (CMP) steps as components of the procedure, a production process is evolved which advantageously exhibits broad tolerance windows, particularly in forming volcano-style emission devices having operationally improved asymmetrical gate structures. In achieving a practical process for producing larger area device arrays, the CMP process steps are uniquely combined with electrode and sacrificial layers which are employed with selectively complementing etchant chemistry.

Other objects of the invention will, in part, be obvious and will, in part, appear hereinafter.

The invention, accordingly, comprises the method possessing the steps which are exemplified by the following detailed disclosure.

For a fuller understanding of the nature and objects of the invention, reference should be made to the following detailed description taken in connection with the accompanying drawings.

BRIEF DESCRIPTION OF THE DRAWINGS

FIG. 1 is a schematic cross-sectional view of a volcano-type field emitter device which may be constructed in accordance with the method of the invention with components shown in exaggerated fashion for clarity;

FIGS. 2A–2C are a flow chart illustrating the process of the invention along with process step associated commentary;

DETAILED DESCRIPTION OF THE INVENTION

Figure 2B:
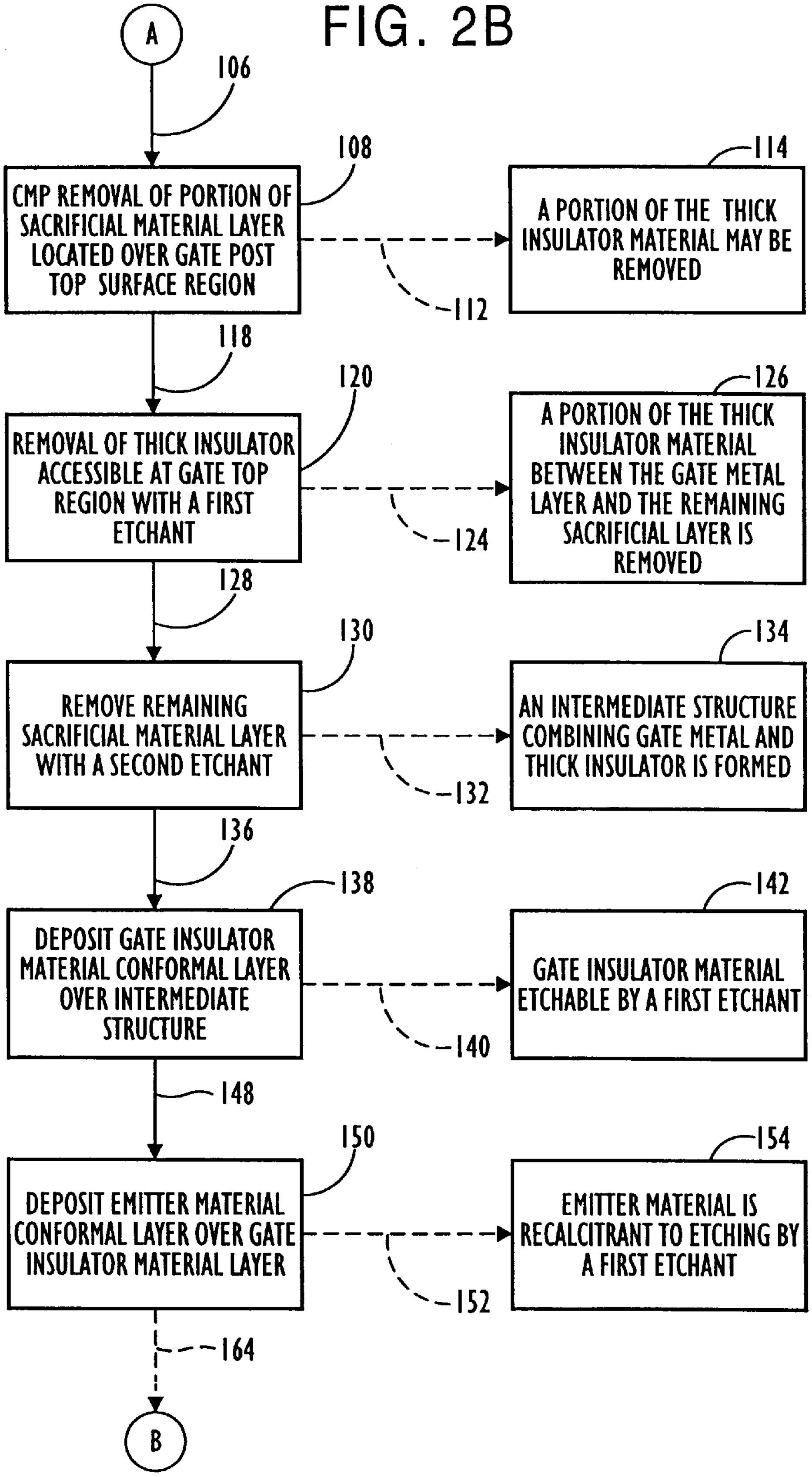

Referring to FIG. 1, the field emitter device structure which may be produced in accordance with the method of the invention is revealed generally at 10. Such field emitter devices as at 10 generally are provided and manufactured as an assemblage arranged in a predetermined pattern upon a substrate. Devices 10 typically individually are addressable by an applied turn-on voltage from a matrix arrangement of conductor components. The structuring of devices 10 within such an assembly includes an electrically insulative substrate assembly represented generally at 12. Insulative substrate 12 is formed, for example, of a ceramic or, preferably glass, which includes a base surface as at 14 which supports and surrounds a post protuberance represented generally at 16 which includes a post sidewall 18 of generally circular cross-section, which extends outwardly from the base surface a predetermined distance to a post top surface 20. In general, when configured within an array, the post protuberances 16 will be spaced in an array in center-to-center fashion in a range, for instance, from about 5 microns to 100 microns. Typically, the sidewalls will have a height, for example, of about 6 microns, however, that height will be selected in dependence upon the overall structure desired. Over the base surface region 14, the sidewalls and top or plateau surface 20 there is deposited an electrically conductive material conformal layer which, for the present embodiment, serves as a conformal gate metal layer and is represented generally as a conformal layer 22 which includes a base coating electrode layer 24 and a post side surface electrode layer 26 having an electrode outer surface 28, here functioning as the outer surface of a gate electrode. The conformal electrode layer 22 also is seen to extend over the post top surface 20 to provide an electrode top layer 30. Electrode layer 22 can be photolithographically defined to form gate lines as are called for in display applications, or this layer can be shaped according to the needs of other applications as required by the designer.

In complement with the electrode layer 22 is a second, complementary electrode, herein provided as an emitter electrode, and shown generally at 32. Emitter electrode conformal layer 32 is spaced from the gate electrode 22 by virtue of its deposition over an intermediate electrically insulative spacer layer represented generally at 34. Insulative layer 34 may be formed of one or more layer type components of insulative material, for example, formed of a thick film ceramic paste, silicon dioxide ($SiO_2$) or aluminum oxide ($Al_2O_3$). Note that the layer 34 has a relatively thicker region seen to extend over the base coating electrode layer as seen at 36, and which continues partially outwardly as at 38 between the post side surface electrode layer 26 and electrode layer 32. Insulative layer 34 then diminishes in thickness at spacer region 40.

This structuring of the insulative layer or layers 34 functions to develop the geometry of electrode (emitter) metal layer 32 such that its spacing at base region second electrode portion 42 from base coating electrode layer 24 is relatively extended. Similarly, such an extended spacing is defined by the insulative material layer at 38 adjacent post side surface electrode layer 26 as represented at 44. Note, however, because of the stepped configuration of the insulative layer 34 which extends outwardly from its region 38 to spacer region 40, a corresponding stepped configuration is provided at emitter electrode layer 32 at its corresponding step region represented generally at 46. With this geometry, an interelectrode gap represented generally at 48 having an inwardly disposed annular surface 50 is developed. Note that for the present embodiment, the outer rim or edge 52 of the emitter or second electrode 32 extends above the surface of a gate electrode top layer 30. The stepped or asymmetrical geometry shown permits the evolution of a relatively low turn-on voltage field emitter device without increasing the gate-to-emitter cross-over capacitance significantly. This is an important feature for the structures, particularly in display applications inasmuch as a large capacitance results in more expensive driver chips or circuits. Generally, the spacing between post side surface electrode (gate) layer 26 and the emitter electrode layer at the interelectrode gap 48 will be from about 0.05 to 1.0 micrometers. Correspondingly, the inwardly disposed portion of the stepped geometry or thicker region will have a spacing distance with a value of about 1.0 to 10.0 micrometers. Note that the rim 52 of the emitter electrode 32 extends slightly above the surface of electrode top layer 30 for the embodiment shown. This configuration, while not necessary, evokes the smallest gate current for the configurations at hand. Generally, the rim 52 may be observed to extend upwardly over the top of electrode surface 30 a distance of from about 0.05 to 1.0 micrometers. While a desirable aspect, such an extension above the top surface of top layer 30 is not necessary for a successful fabrication of an array or assemblage of the devices 10.

Figure 2C:
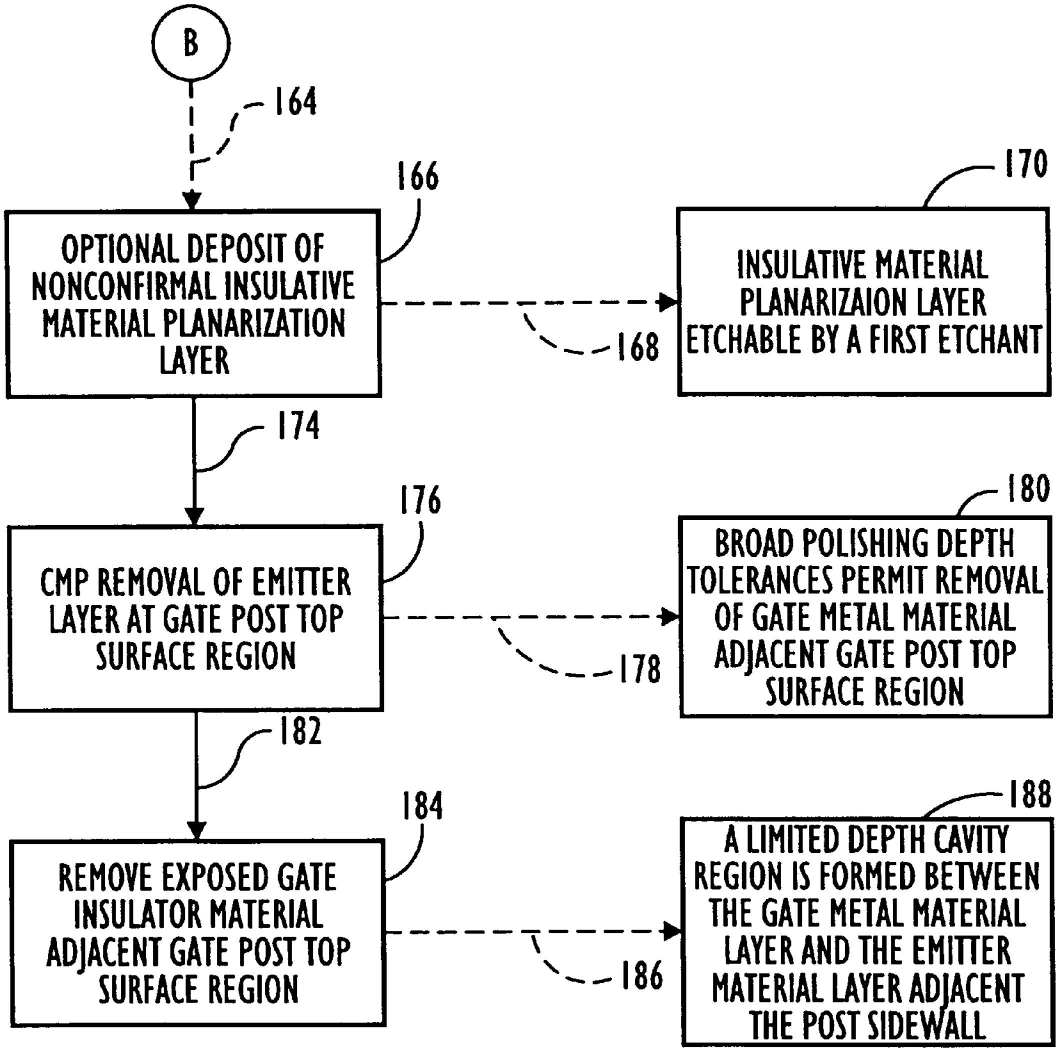
Figure 3:
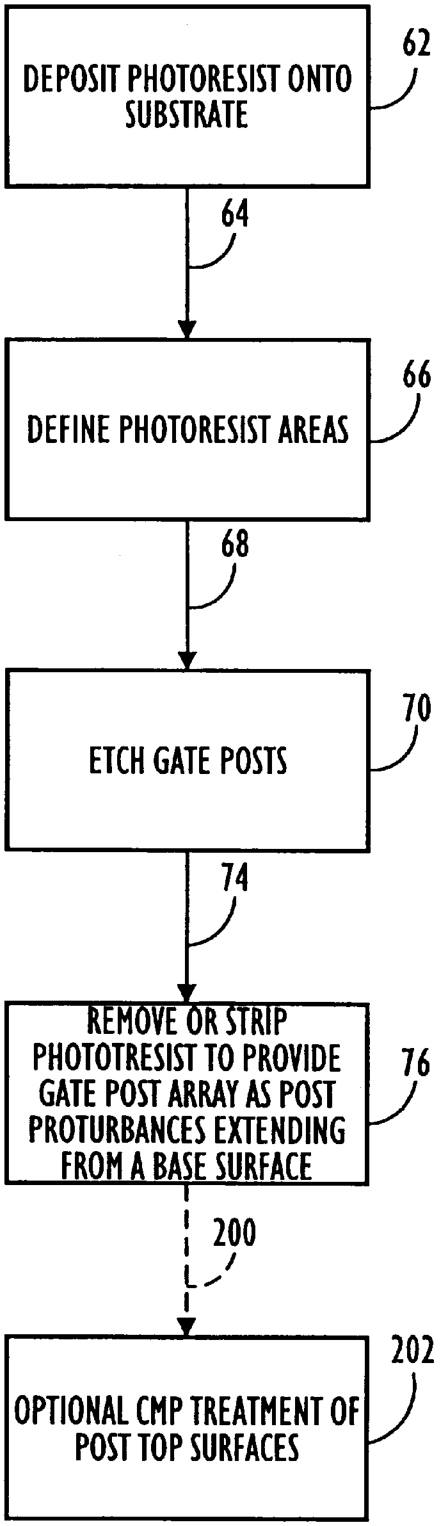
FIG. 3 is an expansion of the initial step in the process described in connection with FIG. 2A.
Figure 4A:
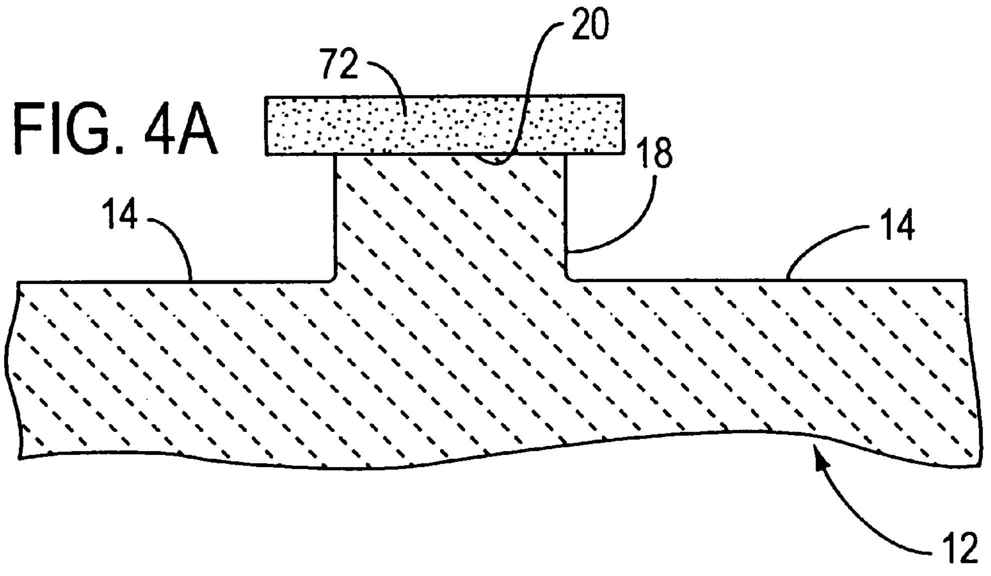
FIG. 4A depicts a substrate configuration occurring during the process described in connection with FIG. 3.

Now referring to FIGS. 2A–2C, a flow diagram is provided illustrating the process of the invention. Referring to that figure, the process commences with block 60 providing for the formation of a gate post array on the insulating substrate 12. The plateau height or post sidewalls 18 of such arrays will range from about 1 micrometer to 10 micrometers with diameters ranging from 2 micrometers to 50 micrometers. Referring momentarily to FIG. 3, a procedure for carrying out this array formation is illustrated. In that figure, as represented at block 62, a photoresist is deposited upon the electrically insulative substrate. Then, as represented at arrow 64 and block 66, the photoresist areas are defined in general as an array of small dot regions of circular border. Then, as represented at arrow 68 and block 70, the gate posts within the substrate are etched at locations without the defined area. Referring additionally to FIG. 4A, this etching procedure is illustrated. In this regard, the photoresist defined area remaining after the etching process is represented at 72, the base surface 14 and post sidewall surface 18 having been etched away. Because etching occurs both vertically and in terms of width, the removal process will take place beneath photoresist 72 as shown.

Returning to FIG. 3, following the etching procedure, as represented at arrow 74 and block 76, the photoresist 72 is stripped and there thus is provided a gate post array which is present as post protuberances extending from the base surface 14.

Returning to FIG. 2A, following the formation of the gate post array on an insulating substrate which preferably will be glass, as represented at arrow 78 and block 80, the electrode layer 24 is deposited, and for the present embodiment is a conformal gate metal layer material deposited over the insulating substrate, including the base surface 14, post sidewall 18, and post top surface 20. This layer 24 can be photolithographically defined to form gate lines as may be needed for display applications or can be shaped according to the needs of other applications. Layer 24 is electrically conductive and is selected of conventional gate metal such as chromium, aluminum, titanium, and the like, with a thickness typically of about 0.2 micrometers. Deposition is by evaporating or sputtering under slight inert gas pressure conditions, for example employing argon as the inert gas. As noted by the dashed arrow 82 and block 84, with the process, that gate metal material which is selected should be recalcitrant to etching by two identified (first and second) etchants which are employed later in the process.

The process then continues as represented by arrow 86 and block 88 wherein a thick or first insulator material conformal layer is deposited over the gate metal layer 22. The thickness of this layer is selected such that, when combined with a next layer selected for establishing the step region 46, it will develop the thicker region described in connection with FIG. 1 at 36.

Figure 4B:
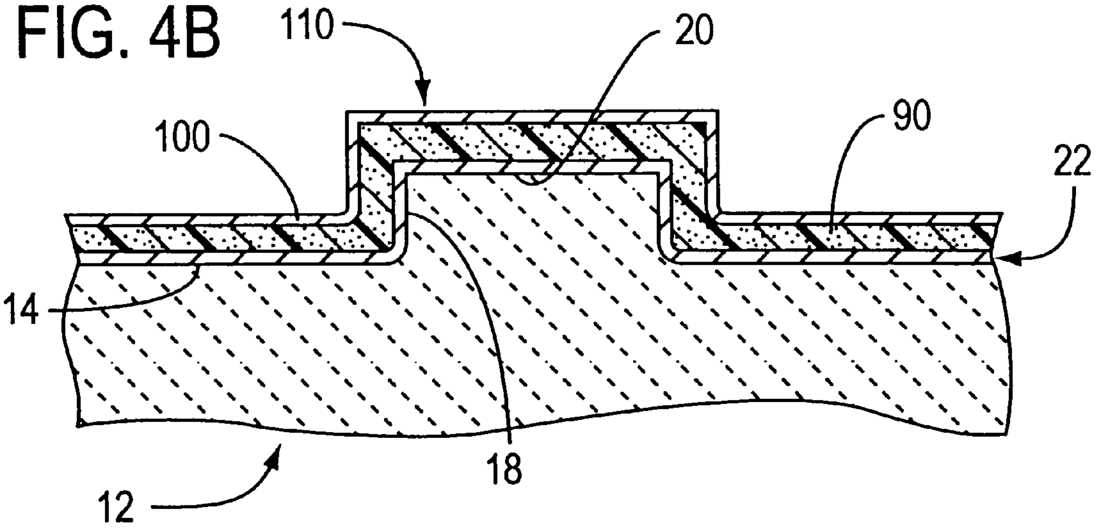
FIG. 4B depicts one intermediate structure including a sacrificial layer developed during the process of the invention.

Looking momentarily to FIG. 4B, this initial insulative conformal layer is represented at 90. Layer 90 may be, for example, a ceramic film paste, particularly if somewhat thick. Where its dimension is smaller, for example, at a thickness of about 1 micrometer, then it typically will be a sputtered insulator such as silicon dioxide ($SiO_2$) or aluminum oxide ($Al_2O_3$). Highly tolerant uniformity of deposition is not required. This layer functions principally to derive the low capacitance structure desired for devices 10. As represented by dashed arrow 92 and the commentary at block 94 in FIG. 2A, this thick insulator material layer 90 is selected such that it is etchable by a first etchant as discussed at block 84 and which is recalcitrant to etching by the second etchant noted in block 84.

Next, as represented by arrow 96 and block 98, a sacrificial material conformal layer is deposited over the thick insulator layer 90. Again turning momentarily to FIG. 4B, this sacrificial layer is shown at 100 as being conformally deposited over the initial insulator layer 90. This sacrificial layer 100 functions to define the first or thick insulator layer 90. As represented at dashed arrow 102 and block 104 in FIG. 2A, the sacrificial material layer is selected as being etchable by the noted second etchant and is further selected as being recalcitrant to etching by a noted first etchant as initially discussed in connection with block 84. For example, the sacrificial layer 100 may be deposited as having a thickness of about 0.2 micrometers and provided as a chrome layer which is relatively facile to deposit and is removable by a chrome etchant.

Figure 4C:
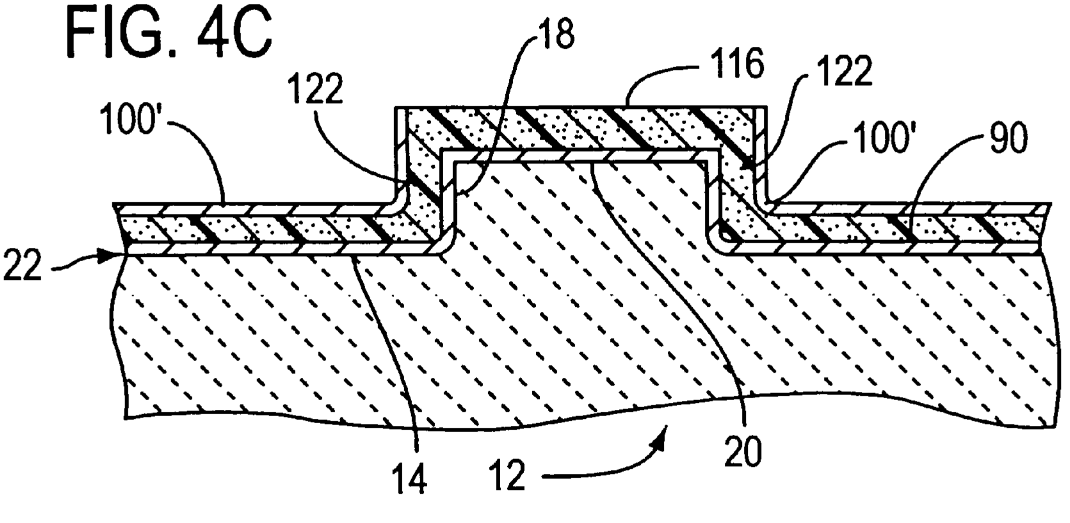
FIG. 4C depicts another intermediate structuring of the emitter devices during the course of the process of the invention which occurs following an initial CMP procedure.

The process continues then as represented at arrow 106, which identifying numeration continues in conjunction with FIG. 2B and block 108. Looking to that figure, block 108 describes the chemical-mechanical polishing (CMP) form of removal of a portion of the sacrificial material layer 100 located over the gatepost top surface region 20 (FIG. 1). Returning momentarily to FIG. 4B, this region of removal is represented generally at 110. Through the use of chemical and abrasive techniques (CMP), the sacrificial layer material at region 110 as well as a portion of the thick insulator material 90 at region 110 may be removed. In the latter regard, as represented at dashed arrow 112 and block 114 in FIG. 2B, the latter aspect of removal of layer 90 is revealed. The result of this procedure is represented in FIG. 4C. Looking momentarily to that figure, the CMP process is seen to have removed the sacrificial metal layer 100 at region 110 as well as a portion of the thick insulator layer 90 to an elevation represented by the plane 116. Note in the figure that the sacrificial layer now identified as 100 as located outwardly from the region 110 remains at this stage of the process. In general, the CMP treatment involves holding or rotating the substrate 12 as formed as described to the present stage of the process against a wetted polishing surface under controlled chemical slurry, pressure and temperature conditions. A chemical slurry containing a polishing agent such as alumina or silica may be utilized as the abrasive medium. Additionally, the chemical slurry may contain chemical etchants. CMP will perform substantially over the entire large substrate surface and is described as proceeding initially at a fast rate and the rate then slows. The removal rate of the CMP process is proportionally related to the pressure and the hardness of the surface being treated. In general, the procedure for the instant utilization requires about 10 seconds. CMP technology is described, for example, in Doan, et al., U.S. Pat. No. 5,229,331 entitled "Method to Form Self-Aligned Gate Structures Around Cold Cathode Emitter Tips Using Chemical Mechanical Polishing Technology", issued Jul. 20, 1993; Gill, Jr., et al., U.S. Pat. No. 4,193,226, entitled "Polishing Apparatus", issued Mar. 18, 1980, leach of which are incorporated herein by reference. Further discussion concerning the technology is described, for instance, as follows:

"Chemical-Mechanical polishing: Route to global planarization" by Martinez, Solid State Technology, May 1994, pp. 26, 29, and 31.

"Manufacturabilty of the CMP Process" by Malik, et al., Thin Solid Films 270 (1995), pp 612–615.

"Effects of Mechanical Characteristics on the Chemical-Mechanical Polishing of Dielectric Thin Films" by Tseng, et al., Thin Solid Films, 290–291, pp 458–463.

"Chemical-Mechanical Polishing: Process Manufacturability" by Jairath, et al., Solid State Technology, July 1994, pp. 71–75.

"Modeling of Chemical-Mechanical Polishing: A Review by Nanz, et al.", IEEE Transactions on Semiconductor Manufacturing, vol. 8, November 1995, pp 382–389.

Figure 4D:
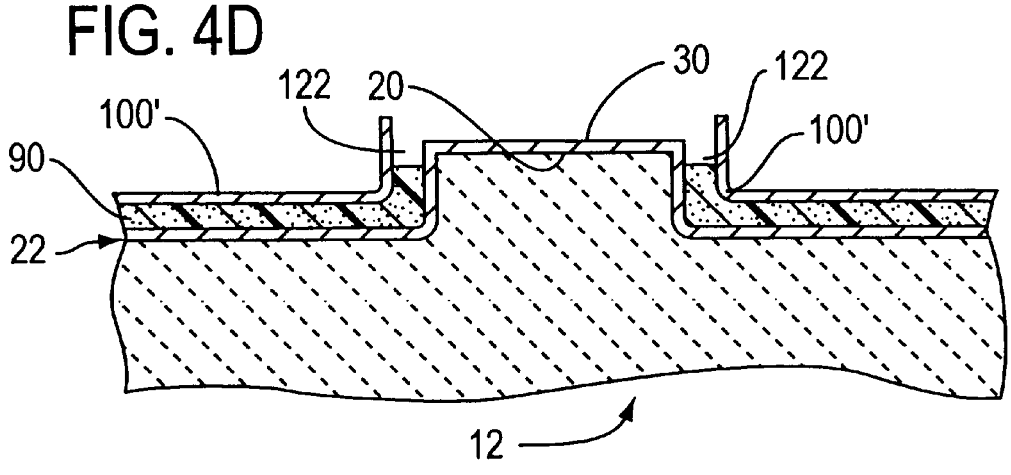
FIG. 4D shows another intermediate structuring of field effect devices developed during the process of the invention which represents a result of the processing step following that evolving FIG. 4C.

With the removal of a portion of the sacrificial layer as represented at plane 116 in FIG. 4C, the process continues as represented at arrow 118 and block 120 in FIG. 2B. At this stage, the first or thick insulator layer 90 is removed in the vicinity of the gate top region with an etchant designated as a first etchant as discussed in connection with block 84. As discussed in connection with block 104, the sacrificial material layer 100 is recalcitrant to etching by that first etchant. However, as noted in conjunction with block 94, the first insulator material layer 90 is etchable by a first etchant. The result of this procedure is to remove the first or thick insulator layer 90 as it exists below the plane 116 (FIG. 4C), and to a predetermined distance within the region 122 intermediate sacrificial layer 100 and gate material layer 22. It may be further recalled that as discussed in connection with block 84, this latter gate material layer 22 is recalcitrant to etching by the noted first etchant. As shown in FIG. 2B in conjunction with dashed arrow 124, the noted removal region 122 or portion of the first insulator material is removed. Looking to FIG. 4D, the sacrificial layer portion 100' is seen to remain while the thick insulator 90 is seen to have been removed, for example by wet chemical etching, to expose the gate electrode 22, top layer 30, and a cavity has been created at removal region 122.

FIG. 2B reveals in conjunction with arrow 128 and block 130 that the next stage in the process is that of removing the remaining sacrificial material layer 100' with a noted second etchant. This second etchant will not affect the gate metal electrode layer 22 as discussed in connection with block 84, nor will it affect the thick or first insulator material layer as discussed in connection with block 94. As represented at dashed arrow 132 and block 134, an intermediate structure combining gate metal and thick insulator is evolved. Looking momentarily to FIG. 4E, this intermediate structure is represented. In developing this structure, either wet chemical or dry etching procedures may be employed to remove the remaining sacrificial layer 100'.

Figure 4E:
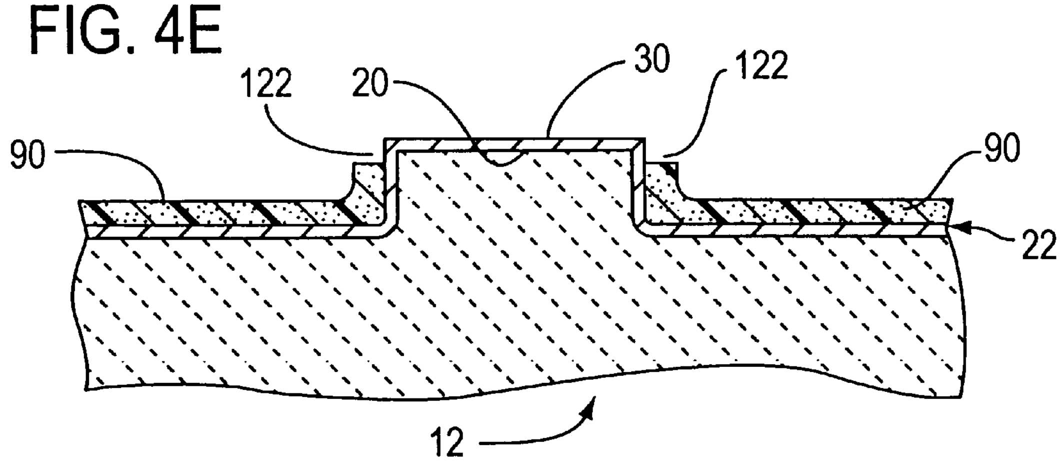
FIG. 4E shows another intermediate structuring occurring during the process of the invention which represents a step following that procedure developing the structure of FIG. 4D.
Figure 4F:
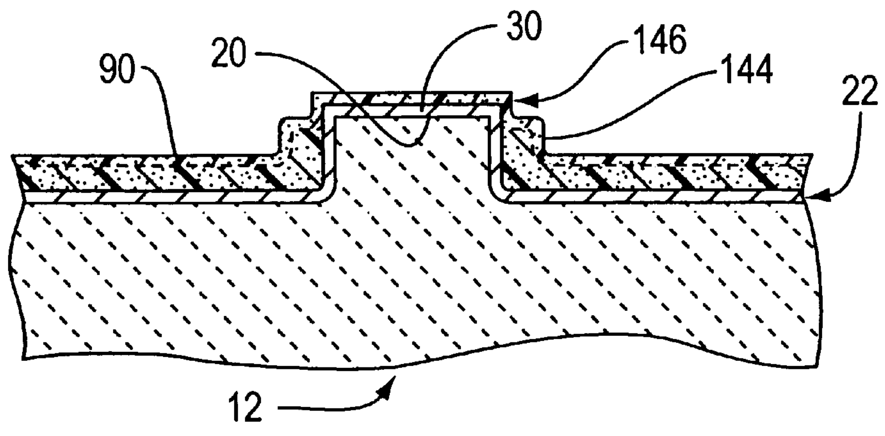
FIG. 4F shows another intermediate structuring developed during the process of the invention which occurs as a consequence of a step following the procedure carried out to develop the structure seen in FIG. 4E.

Returning to FIG. 2B, the process continues as represented at arrow 136 and block 138 wherein a gate insulator material conformal layer is deposited over the intermediate structure represented at FIG. 4E. As described in connection with dashed arrow 140 and block 142, this deposited gate insulator material is etchable by a first etchant in the manner that the first insulator material layer is etchable by such an etchant as discussed in connection with block 94. Looking momentarily to FIG. 4F, this second or thin insulator conformal layer is shown at 144 and functions to define the distance between the gate metal layer 22 and the emitter layer 32 as described in conjunction with FIG. 1. Thus, the step region 46 of intermediate electrically insulative spacer layer 34 as discussed in connection with FIG. 1 commences to be formed. Generally, the thickness of the layer at that step region or at the region 146 shown in FIG. 4F will be from about 0.05 to 1.0 micrometers. Typically, the material employed for the initial insulator layer 90 and layer 144 will be the same but that is not a requirement for the process. For example, if the thick insulator layer 90 is formed of a ceramic paste, which has inclusions or a roughness to it, then it is desirable that the second or thin insulator layer 144 exhibit a higher quality, for example, a silicon dioxide ($SiO_2$) deposited by chemical vapor deposition or an aluminum oxide ($Al_2O_3$), or tantalum pentoxide ($Ta_3O_5$) may be employed.

Returning to FIG. 2B, the process then proceeds as represented at arrow 148 and block 150 providing for the deposition of an emitter material conformal layer over the gate insulator material layer now having been formed and represented generally at 34 and region 46 as discussed in connection with FIG. 1. As represented by dashed arrow 152 and block 154, the thus-deposited emitter material will be recalcitrant to etching by a first of the etchants in the same manner as the gate metal material as discussed in connection with block 84.

Figure 4G:
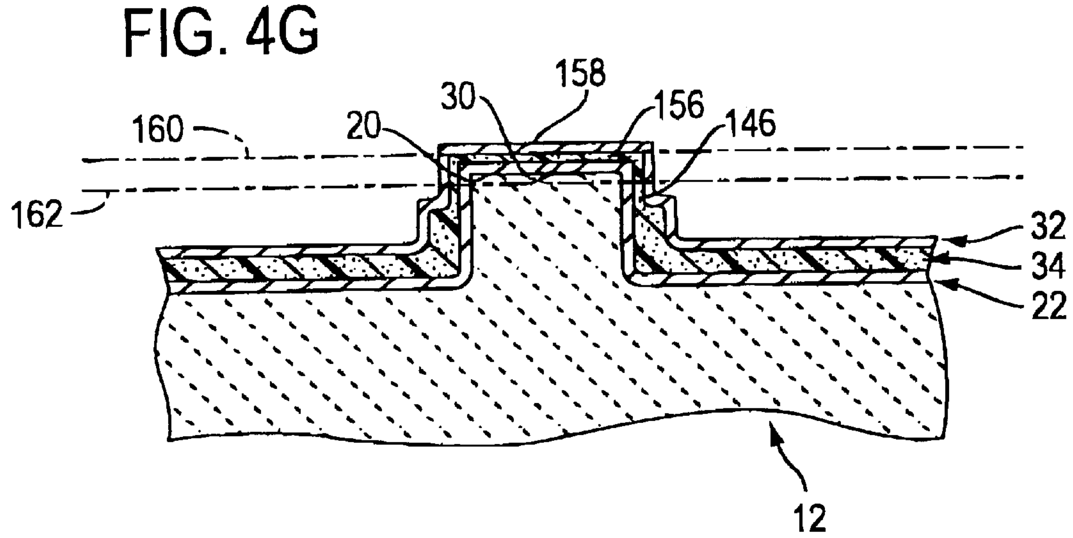
FIG. 4G shows another structuring occurring in the course of the process of the invention, depicting additionally the broad tolerancing permitted for a next occurring CMP procedure.

Looking momentarily to FIG. 4G, the resultant structure is shown. In this regard, the second electrode conformal or emitter conformal layer earlier described at 32 in connection with FIG. 1 again is represented in general by that numeration. Typical emitter materials are, for example, silicon carbide, gold, tungsten, molybdenum, and the like. Generally, the thickness of the emitter layer 32 ranges from about 0.05 microns to 1.0 microns. Note, that the emitter layer extends over a region which is a portion of the second insulator layer 144 extending over electrode top layer 30 as seen at 156. This portion of the emitter layer 32 is seen at 158. It is necessary to remove that electrode component at region 158, as well as the region 156 of the second insulator or thin insulator layer as shown at 156, as a next procedure. The range or tolerances which are permitted for this removal procedure are quite broad. In this regard, an adequate removal can be between the planes 160 and 162 as seen in FIG. 4G. Removal of material within the range defined by planes 160 and 162 preferably is carried out by chemical-mechanical polishing (CMP).

Figure 8:
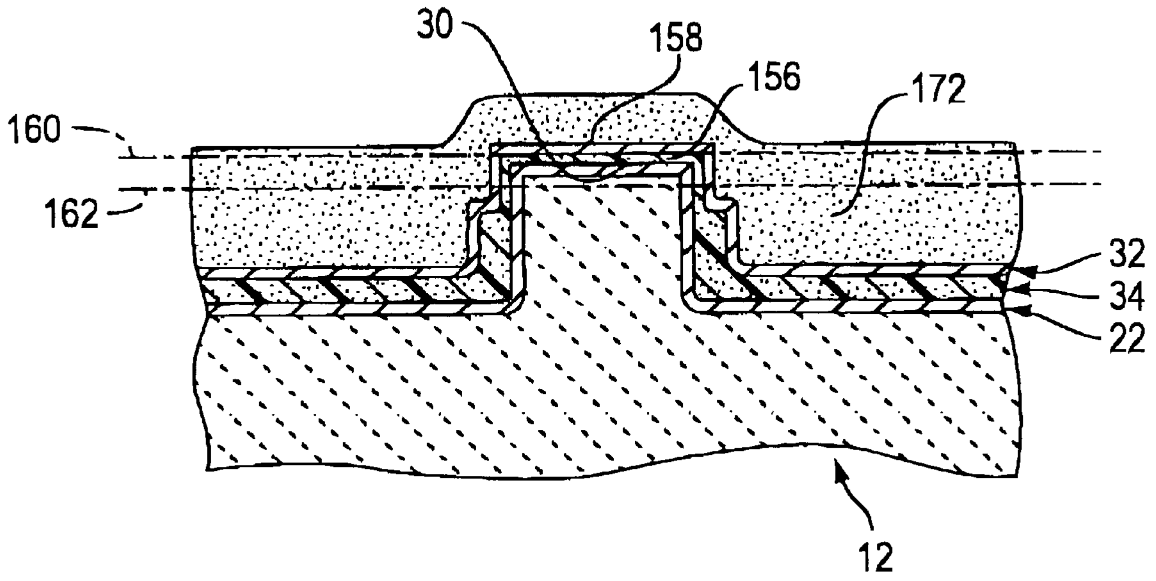
FIG. 8 is a cross-sectional representation of an intermediate structure according to the invention showing the addition of an optional planarization layer.

An optional processing stage may be employed at this juncture. This optional stage processing is represented by dashed arrow 164 as shown in FIG. 2B which reappears in FIG. 2C in conjunction with block 166. For this optional arrangement, a deposit of non-conformal insulative material planarization layer may be provided. As represented by dashed arrow 168 and block 170, this insulative material planarization layer should be etchable by a first of the noted etchants. The planarization layer option represented at blocks 166 and 170 accommodates for variations from CMP process due, for example, to the hardness characteristics of gate metal layer 22, the second thin insulator layer at 146, and the emitter layer 32 as it extends to the region 158. Because of the hardness relationship of these components with respect to the somewhat flexible components and chemical activities of the CMP process, some rounding of the polishing profile might occur, for example, leaving the rim 52 (FIG. 1) of layer 32 below the top surface of the gate material region 30. If such rounding is not acceptable from a device performance point of view, a planarization layer such as a photoresist, spin-on glass, polyimide, or the like can be applied on top of the substrate prior to the CMP step to follow. Such an arrangement is revealed in FIG. 8.

Looking to that figure, the structure developed to the stage represented in FIG. 4G is seen covered with a planarization layer 172. As such, this structure is now prepared for CMP treatment as an optional approach to the method of the invention.

Figure 5A:
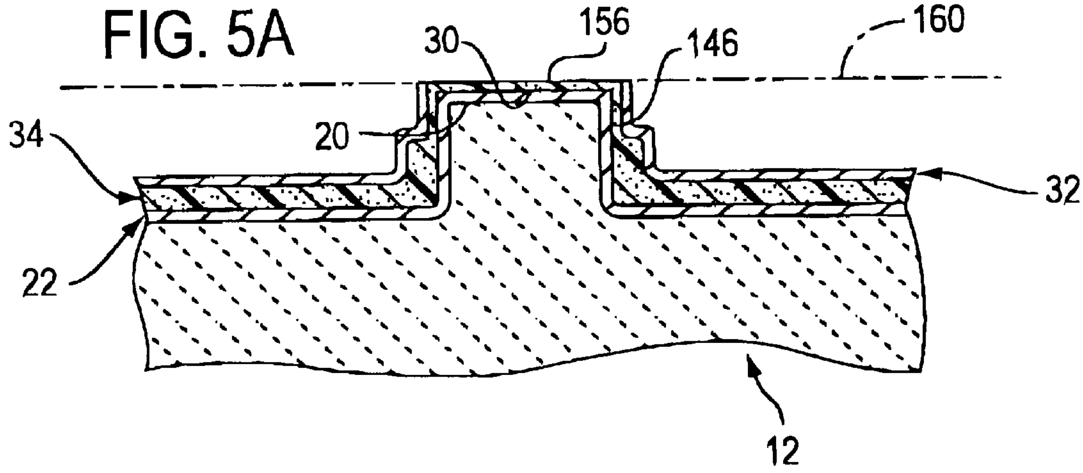
FIG. 5A depicts an intermediate structure following a CMP treatment of the structure of FIG. 4G under an optimum condition.

Returning to FIG. 2C, that next CMP step is represented at arrow 174 and block 176 providing for the chemical-mechanical polishing (CMP) removal of the emitter layer at the gatepost top surface region. As represented at dashed arrow 178 and block 180, this removal procedure may take place, for example, within the wide tolerances represented at planes 160 and 162 seen in FIGS. 4G and 8. These broad polishing tolerances, as represented at plane 162 permit the removal of gate metal material adjacent the gatepost top surface region, i.e. gate material 22 at electrode top layer 30 region. One such configuration resulting from the permissible variation in CMP depth is represented in FIG. 5A. The structure of FIG. 5A may be considered optimal from a resultant performance standpoint. Note that the gate electrode 22 at region 30 over the top of the gatepost at 20 remains intact and the upwardly deposited region 156 of second insulative coating layer 144 is intact.

Figure 5B:
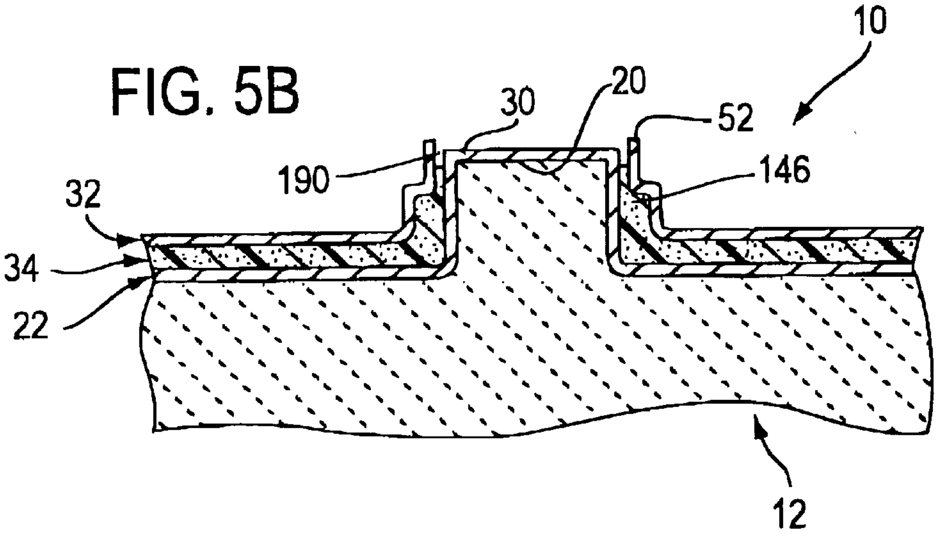
FIG. 5B is a cross-sectional view of a completed field effect device developed from the intermediate structure of FIG. 5A.
Figure 6A:
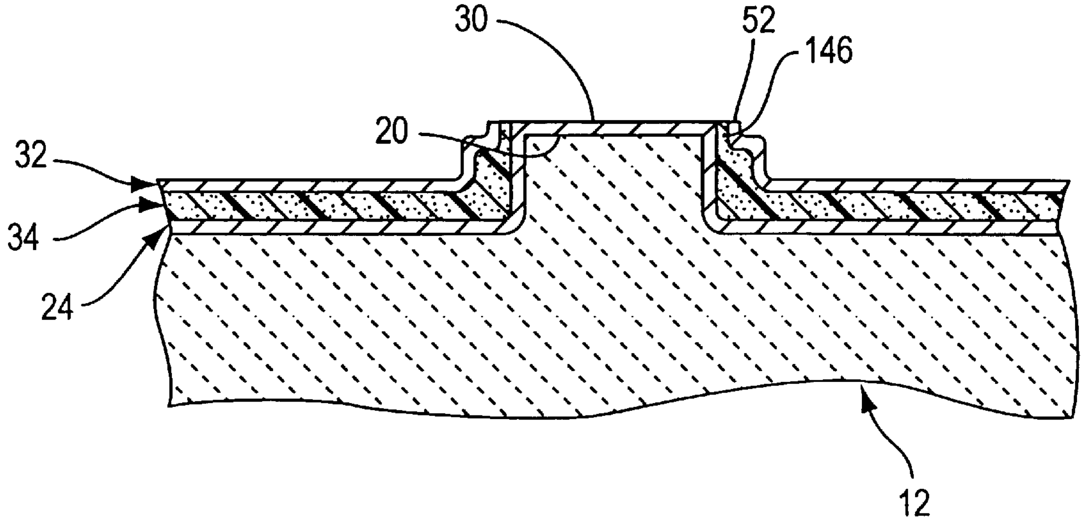
FIG. 6A is a cross-sectional view of an intermediate structuring developed from the structure represented in FIG. 4G following a CMP procedure wherein gate material remains at the top of a gatepost protuberance.
Figure 6B:
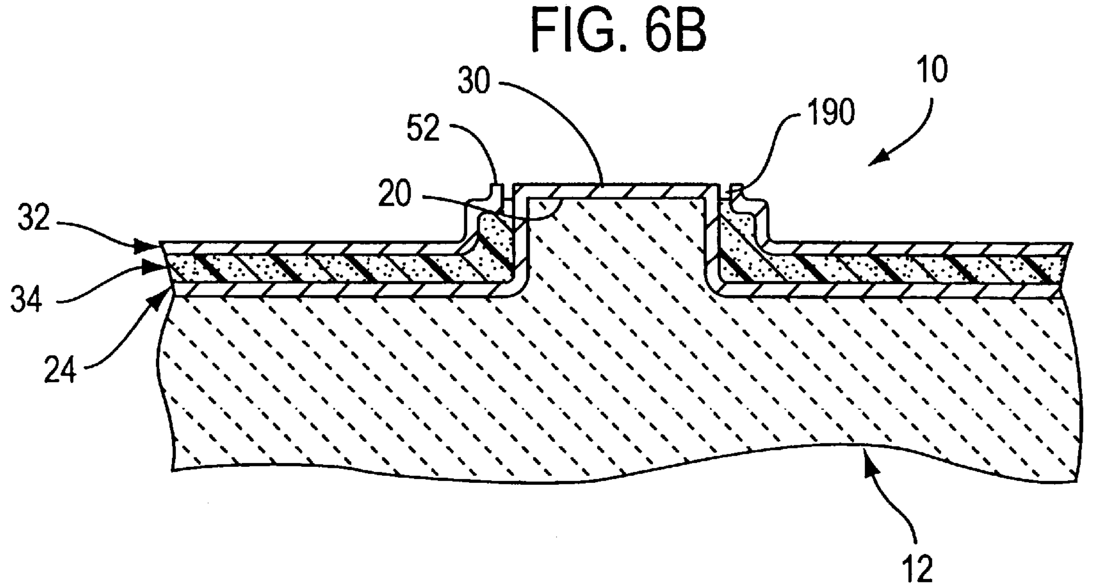
FIG. 6B is a cross-sectional representation of a field effect device according to the invention developed from the intermediate structure of FIG. 6A.

Returning momentarily to FIG. 2C, the next step in the procedure is, as represented at arrow 182 and block 184, that of removing the exposed gate insulator material adjacent the gatepost top surface region. This, as represented in FIG. 5A is the material at region 156 and that same material as it extends into the inwardly stepped region 146. As represented by dashed arrow 186 and block 188, a limited depth cavity region is formed between the gate metal material layer 22 and the emitter material layer adjacent the post sidewall. The resultant completed structure is represented in FIG. 5B. Looking to that figure, it may be observed that the gate metal at region 30 is intact and that the second insulative material layer at region 156 has been removed by a noted first etchant. There thus is developed an annular cavity 190 extending below the gate metal 30 between the electrode or gate layer 22 and emitter layer 32. Note additionally, that the outward rim or edge 52 (FIG. 1) has been defined and that ridge extends upwardly over the top surface of the electrode top layer 30. This configuration, from a performance standpoint, represents the topology developing the smallest gate current of all the available configurations. However, achieving this configuration is not mandatory to the success of an array developed according to the process. In the latter regard, reference is made to FIG. 6A where the CMP process as represented at block 176 (FIG. 2C) will have removed the thin or second insulative layer 156 (FIG. 5A) and the rim 52 is essentially planar with the top surface of electrode or gate top layer 30. Upon carrying out the removal of exposed gate insulator material as represented at block 184 (FIG. 2C), the resultant structure 10 is revealed in FIG. 6B. For this arrangement or topology, note that the gate metal at top layer 30 remains and the annular gap 190 remains as before.

Figure 7A:
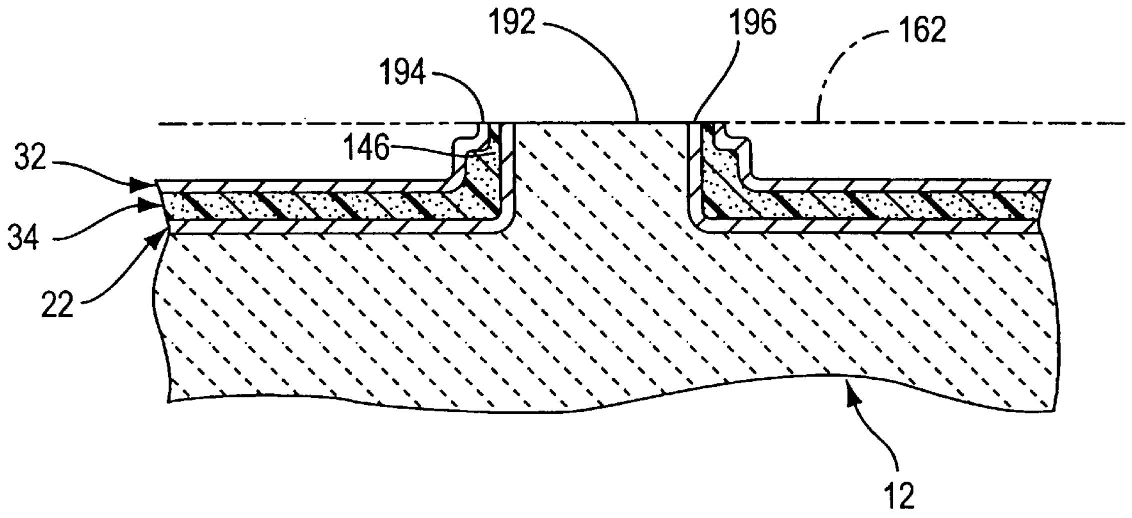
FIG. 7A is a cross-sectional representation of an intermediate structure developed following a CMP treatment of the structure of FIG. 4G to a lower plane elevation revealed therein.
Figure 7B:
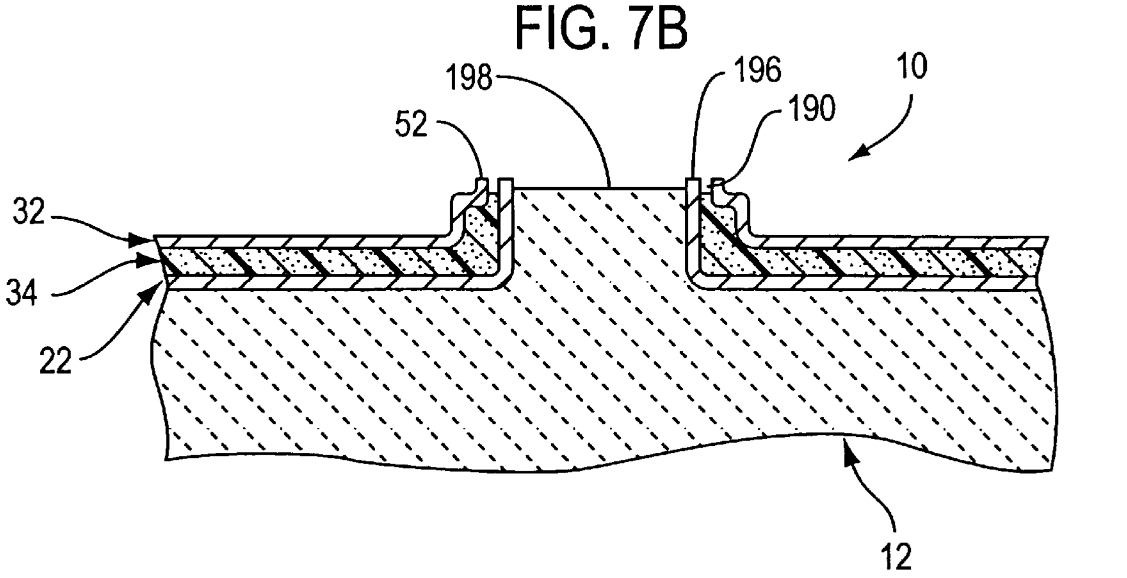
FIG. 7B is a cross-sectional representation of a device developed from the intermediate structure of FIG. 7A with portions omitted in the interest of clarity.

For conditions where the CMP removal step of block 176 (FIG. 2C) carries out a removal to the extent represented at plane 162 as discussed in connection with FIG. 4G, then a structuring as represented in FIG. 7A is developed. Looking to that figure, it may be observed that the post top surface 20 is no longer present and a post top surface 192 of lesser elevation is present. Additionally, the emitter electrode layer 32 has been polished to define a top rim surface 194 which will be seen to become rim 52. Additionally, the gate top surface 30 has been removed such that the gate material electrode layer 22 extends to a top rim surface 196. Upon carrying out the removal of exposed gate insulator material in accordance with block 184 (FIG. 2C), the structure 10 as represented in FIG. 7B is realized. In this structure, the rim 194 now becomes earlier-described rim 152 and is spaced apart from the gate rim 196 to define the gap 190. Note additionally that etching with the noted first etchant typically will have removed a portion of the substrate 12 material to develop an upper gatepost surface seen at 198. From the foregoing, it may be observed that extensive manufacturing tolerances or process windows are realized with the method of the invention.

A third use of the CMP process also may be employed with the instant method. In this regard, at the initial formation of the substrate structure, an additional step may follow that described in FIG. 3 at block 76. That step is that of CMP treatment of the gatepost array structure such that the gatepost top plateau regions 20 will be substantially coplanar. Returning to FIG. 3, this optional step is represented by dashed arrow 200 and block 202.

Since certain changes may be made in the above method without departing from the scope of the invention herein involved, it is intended that all matter contained in the above description or shown in the accompanying drawings shall be interpreted as illustrative and not in a limiting sense.

I claim:

1. A process for the formation of a cold electron emission source, comprising the steps of:

(a) providing an electrically insulative substrate having a base surface supporting at least one post protuberance having a sidewall extending from said base surface a predetermined distance to a post top surface;

(b) depositing a first electrically conductive material layer over said base surface region and said post protuberance;

(c) depositing a first electrically insulative material layer over said first electrically conductive layer;

(d) depositing a sacrificial material layer over said first electrically insulative material layer;

(e) removing that portion of said sacrificial material layer which is located over said first electrically insulative material layer at said post top surface by chemical mechanical polishing;

(f) removing that portion of said first electrically insulative material layer which is located adjacent said post top surface and within a region of predetermined length adjacent to and extending toward said base surface region along said post sidewall;

(g) removing remaining said sacrificial layer;

(h) depositing a second electrically insulative material layer over exposed said first electrically conductive material layer and said first electrically insulative material layer;

(i) depositing a second electrically conductive material layer over said second electrically insulative material layer; and (j) removing that portion of said second electrically conductive material layer adjacent said post top surface to define a rim having an outer edge.

2. The process of claim 1 including the step of:

(k) removing a select portion of said second electrically insulative material layer situate intermediate said first and second electrically conductive material layers.

3. The process of claim 2 in which:

said first electrically conductive material is recalcitrant to etching by first and second etchants;

said first electrically insulative material exhibits etchability by said first etchant and is recalcitrant to etching by said second etchant; and said step (f) is carried out by etching with a said first etchant.

4. The process of claim 3 in which:

said sacrificial material exhibits etchability by said second etchant and is recalcitrant to etching by said first etchant; and said step (g) is carried out by etching with a said second etchant.

5. The process of claim 3 in which:

said second electrically insulative material is etchable by a said first etchant;

said second electrically conductive material is recalcitrant to etching by said first and second etchants; and said step (k) is carried out by etching with a said first etchant.

6. The process of claim 1 in which said step (j) is carried out by chemical mechanical polishing.

7. The process of claim 1 in which:

said step (d) is carried out by depositing said first electrically insulative material layer at a first thickness; and said step (h) is carried out by depositing said second electrically insulative material layer at a second thickness less than said first thickness.

8. The process of claim 1 in which:

said step (i) includes the step:

(i1) depositing an electrically insulative planarization layer over said second electrically conductive material layer; and said step (j) is carried out by chemical mechanical polishing to remove said planarization layer to an extent wherein the resultant outer surface of said planarization layer and said rim outer edge are substantially coplanar.

9. The process of claim 1 in which said step (a) includes the steps of:

(a1) depositing a photoresist upon a surface of said electrically insulative substrate;

(a2) defining a photoresist region for said at least one post protuberance;

(a3) stripping said photoresist; and (a4) etching said substrate to produce said at least one post protuberance.

* * * * *